(12) United States Patent
Yamamoto

(10) Patent No.: US 7,838,990 B2
(45) Date of Patent: Nov. 23, 2010

(54) HIGH-FREQUENCY HERMETICALLY-SEALED CIRCUIT PACKAGE

(75) Inventor: Fumio Yamamoto, Sano (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 66 days.

(21) Appl. No.: 12/353,100

(22) Filed: Jan. 13, 2009

(65) Prior Publication Data

US 2009/0127675 A1    May 21, 2009

Related U.S. Application Data

(63) Continuation of application No. 11/535,311, filed on Sep. 26, 2006, now abandoned.

(30) Foreign Application Priority Data

Mar. 29, 2006 (JP) ............... 2006-091162

(51) Int. Cl.
*H01L 23/04* (2006.01)
(52) U.S. Cl. ............ 257/728; 257/664; 257/693; 257/701; 257/730; 257/E23.181
(58) Field of Classification Search ......... 257/664, 257/693, 701, 728, 730, E23.181
See application file for complete search history.

(56) References Cited

U.S. PATENT DOCUMENTS 3,784,884 A * 1/1974 Zoroglu ............ 257/664
4,150,393 A   4/1979 Wilson et al.
4,427,991 A   1/1984 Yamamura et al.
4,626,805 A   12/1986 Jones
4,713,634 A * 12/1987 Yamamura ............ 333/245
5,406,120 A * 4/1995 Jones ............ 257/706
6,441,697 B1  8/2002 Garland et al.
6,455,932 B1  9/2002 Katahira
6,559,533 B1  5/2003 Yamamoto

FOREIGN PATENT DOCUMENTS

JP    2001-35948    2/2001

* cited by examiner

*Primary Examiner*—Marcos D. Pizarro
(74) *Attorney, Agent, or Firm*—Oblon, Spivak, McClelland, Maier & Neustadt, L.L.P.

(57) ABSTRACT

A semiconductor package includes a base substrate on which semiconductor elements are disposed; a covering member which is provided to the base substrate, which covers the semiconductor elements, and which includes an opening at an end thereof at the side of the base substrate; and a connector substrate which is provided on the base substrate in a manner that the connector substrate closes the opening, which includes a first high-frequency signal line in an area located inside the covering member for a first surface, and which includes a second high-frequency signal line on a second surface being a surface on the opposite side of the first surface, the second high-frequency signal line being electrically connected to the first high-frequency signal line; wherein the base substrate is formed in a manner that the base substrate is located away from the second high-frequency signal line.

6 Claims, 6 Drawing Sheets

BACKGROUND ART

FIG. 5

|  | EXAMPLE | COMPARATIVE EXAMPLE |
|---|---|---|
| PERMITTIVITY $\varepsilon_1$ OF CONNECTOR SUBSTRATE | 9.0 | 9.0 |
| THICKNESS t1 (mm) OF CONNECTOR SUBSTRATE | 0.4 | 0.4×2 |
| THICKNESS t2 (mm) OF AIR LAYER | 0.5 | - |
| WIDTH (mm) OF HIGH-FREQUENCY SIGNAL LINE | 0.644 (=W2) | 0.148 |
| WIDTH (mm) OF GROUND CONDUCTOR | 3.0 (=W3) | INFINITY | ial Applications

This application is a Continuation of U.S. application Ser. No. 11/535,311, filed on Sep. 26, 2006, and is based upon and claims the benefit of priority from the prior Japanese Patent Application No. 2006-91162, filed on Mar. 29, 2006; the entire contents of both of which are incorporated herein by reference.

BACKGROUND OF THE INVENTION

1. Field of the Invention

The present invention relates to a semiconductor package, and particularly to a semiconductor package in which a semiconductor element is hermetically sealed.

2. Description of the Related Art

Semiconductor packages with semiconductor elements, such as high-frequency semiconductor elements, have been used for various high-frequency devices (for example, refer to JP-A 2001-35948 (KOKAI)). Such semiconductor packages include one (a hermetic seal package) in which a semiconductor element is hermetically sealed, and which includes a base substrate to which the semiconductor element is disposed; a frame body which is provided on the base substrate, and which surrounds the semiconductor element; a lid body which is provided on the frame body; and a connector substrate which is passed through the frame body, and which is provided on the base substrate.

For example, as shown in FIG. 1, a connector substrate 101 is provided on a base substrate 102. The connector substrate 101 is formed of dielectrics, and is a substrate which closes an opening 104 formed in a frame 103 which is a frame body. The connector substrate 101 includes a convex part 105 for closing the opening 104, and a high-frequency signal line 106, which is passed through the convex part 105, is provided to a surface of the connector substrate 101. On the peripheral surface of the connector substrate 101, an outer frame 101a to which W paste is applied, followed by sintering, is provided. The outer frame 101a and the frame 103 are brazed with Ag, and a hermetic seal package is formed.

A portion, through which the high-frequency signal line 106 penetrates, functions as a triconductor part (a stripline part) 106a, and other portion functions as a micro-strip line part. The triconductor part 106a of the high-frequency signal line 106 is formed thinner than the micro-strip line part in order to match impedance of the triconductor part 106a with that of the micro-strip line part (refer to FIG. 1).

However, recently, semiconductor packages have been developed into those with high power. When the width of the high-frequency signal line 106 is made smaller, the insertion loss of a high-frequency signal is increased, and allowable current of the high-frequency signal line 106 is lowered. Consequently, there are cases where the triconductor part 106a of the high-frequency signal line 106 melts.

SUMMARY OF THE INVENTION

An object of the present invention is to provide a semiconductor package with which melting of a high-frequency signal line due to high power can be suppressed, and with which insertion loss of the high-frequency signal is prevented from being increased.

An aspect of embodiments of the present invention is that a semiconductor package includes a base substrate on which a semiconductor element is disposed; a covering member which is provided to the base substrate, which covers the semiconductor elements, and which includes an opening at an end thereof at the side of the base substrate; and a connector substrate which is provided on the base substrate to close the opening, and which includes a first high-frequency signal line and a second high-frequency signal line. The first high-frequency signal line is in an area located in the covering member for a first surface. The second high-frequency signal line is on a second surface which is a surface on the opposite side of the first surface, and is electrically connected to the first high-frequency signal line. The base substrate is formed in a manner that the base substrate is located away from the second high-frequency signal line.

BRIEF DESCRIPTION OF THE DRAWINGS

FIG. 5 is an explanatory view showing various design values of the semiconductor package in a case of setting a characteristic impedance at 50Ω;

DETAILED DESCRIPTION OF THE PREFERRED EMBODIMENTS

First Embodiment

A first embodiment of the present invention will be described with reference to FIGS. 2 to 5.

Figure 2:
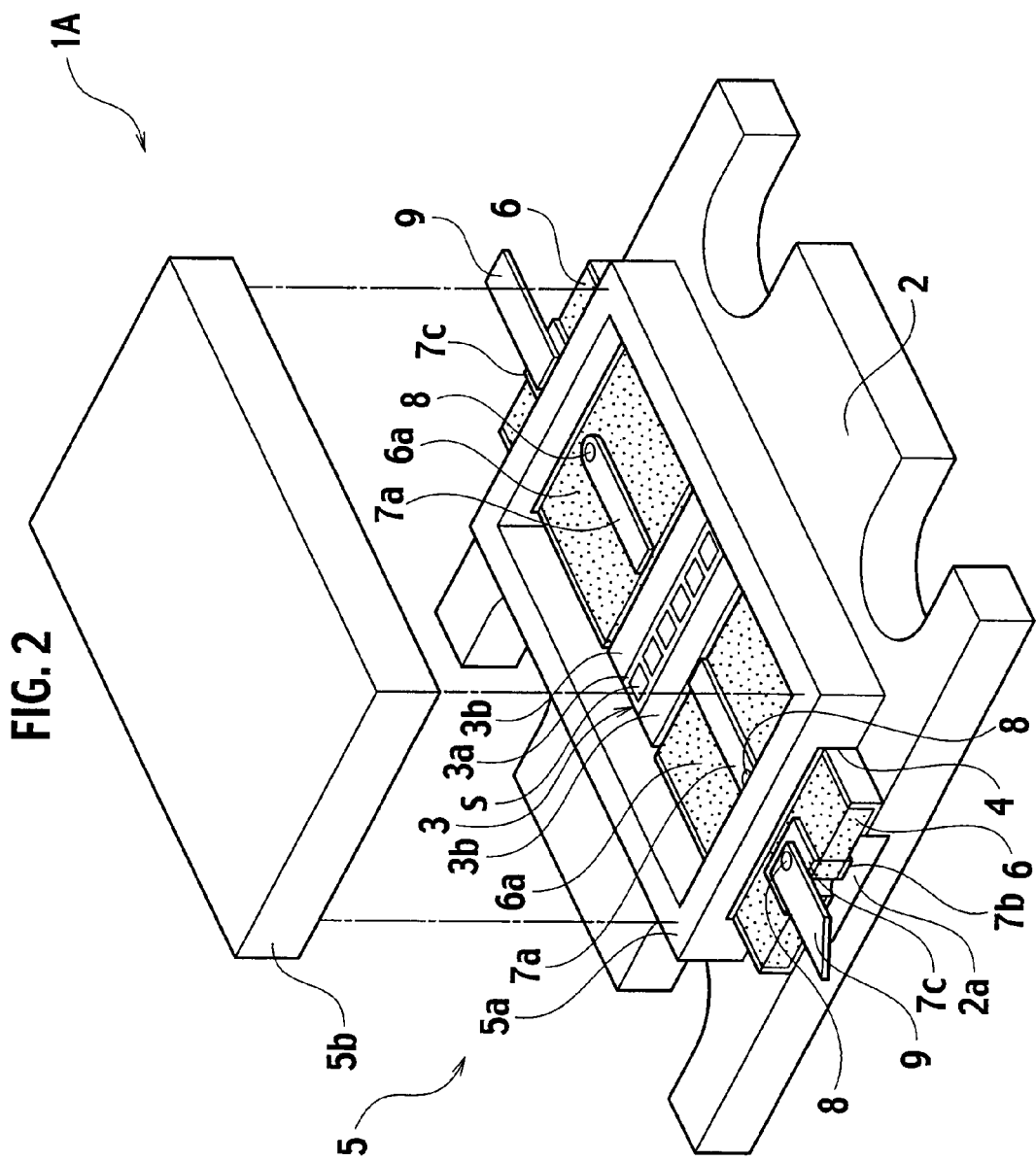
FIG. 2 is an exploded perspective view schematically showing a configuration of a semiconductor package of a first embodiment of the present invention.
Figure 3:
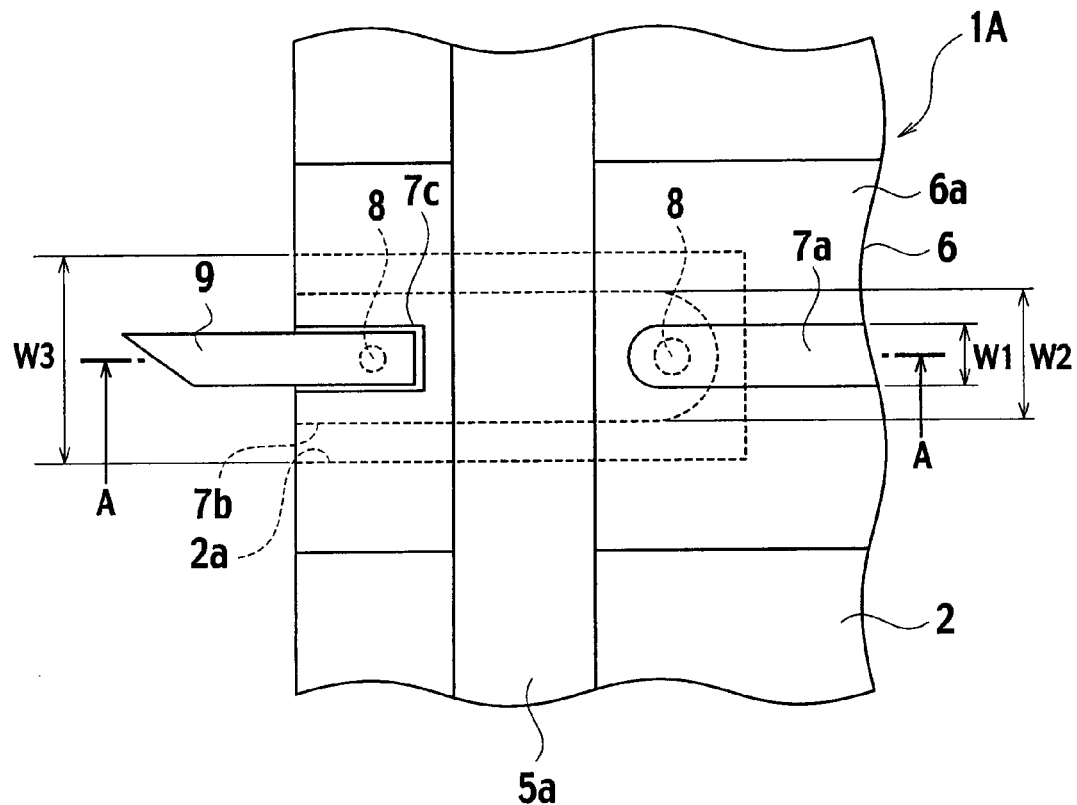
FIG. 3 is a plan view showing a part of the semiconductor package shown in FIG. 2.
Figure 4:
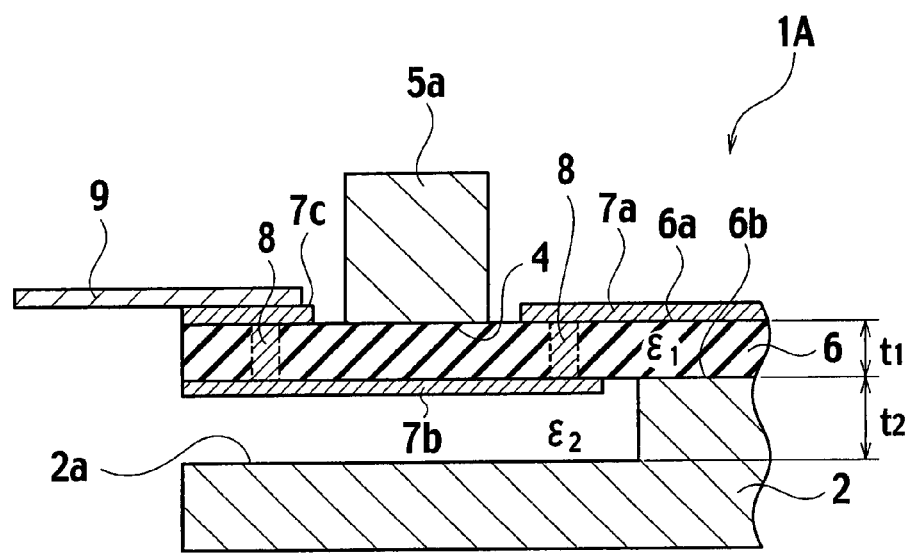
FIG. 4 is a cross-sectional view taken along the A-A line in FIG. 3.

As shown in FIGS. 2 to 4, a semiconductor package 1A of the first embodiment of the present invention includes a base substrate 2; a semiconductor mounting part 3 which is provided on the base substrate 2, and which includes a plurality of semiconductor elements S; a covering member 5 which is provided to the base substrate 2, which covers the respective semiconductor elements S, and which includes an opening 4 at an end thereof at the side of the base substrate 2; and a connector substrate 6 which is provided on the base substrate 2 to close the opening 4, and which includes a first high-frequency signal line 7a and a second high-frequency signal line 7b. The first high-frequency signal line 7a is in an area located in the covering member 5 for a first surface 6a. The second high-frequency signal line 7b is on a second surface 6b (refer to FIG. 4) which is the surface on the opposite side of the first surface, and is electrically connected to the first high-frequency signal line 7a.

The semiconductor mounting part 3 includes the semiconductor elements S; a mounting part 3a which supports the semiconductor elements S; two matching condensers 3b which are provided on the mounting part 3a, and which are placed respectively on both sides of an array of the semiconductor elements S. These matching condensers 3b are electrically connected to the respective semiconductor elements S by wire bonding or the like.

The covering member 5 includes a frame 5a which is formed into a frame-like shape, and which is provided on the base substrate 2; and a lid member 5b which is a lid body provided on the frame 5a. The semiconductor mounting part 3 is housed in the covering member 5. Thereafter, the semiconductor mounting part 3 is hermetically sealed in the covering member 5. Two openings 4 are provided to the frame 5a in a way that the two openings 4 face each other. These openings 4 are respectively situated on ends at the side of the base substrate 2.

The connector substrate 6 is a substrate which is formed into a plate-like shape, and which is formed of dielectrics having a certain permittivity. The connector substrate 6 functions as a member which closes the openings 4 of the frame 5a. To the first surface 6a of the connector substrate 6, the first high-frequency signal line 7a is provided in a manner that the first high-frequency signal line 7a is located inside the frame 5a, and a third high-frequency signal line 7c is provided in a manner that the third high-frequency signal line 7c is located outside the frame 5a. Furthermore, the second high-frequency signal line 7b is provided to the back surface which is the second surface 6b (refer to FIG. 4) of the connector substrate 6.

The first high-frequency signal line 7a, the second high-frequency signal line 7b, and the third high-frequency signal line 7c are respectively transmission lines through which high-frequency signals pass. The first high-frequency signal line 7a, the high-frequency signal line 7b and the high-frequency signal line 7c are connected to one another respectively through a plurality of through-hole wirings 8 formed on the connector substrate 6.

The first high-frequency signal line 7a is extended from an internal end of the connector substrate 6, the internal end being towards the center inside the frame 5a, in the direction toward an external end of the connector substrate 6 outside the frame 5a, the internal end facing the external end. The first high-frequency signal line 7a is provided up to a position in front of the frame 5a so as not to contact therewith. The first high-frequency signal line 7a is electrically connected to the matching condenser 3b. The third high-frequency signal line 7c is provided from a position in the vicinity of the frame 5a to an external end of the connector substrate 6. The second high-frequency signal line 7b is electrically connected to the first high-frequency signal line 7a and to the third high-frequency signal line 7c through the respective through-hole wirings. These first high-frequency signal line 7a, the second high-frequency signal line 7b, and the third high-frequency signal line 7c are formed of, for example, a W thick film or a Cu thick film, Ni plating, Au plating, and the like. The through-hole wirings 8 are formed into blind through-holes for a hermetic seal.

To the third high-frequency signal line 7c, a lead wire 9 is provided to draw out the third high-frequency signal line 7c from the semiconductor package 1A. The lead wire 9 is electrically connected to the third high-frequency signal line 7c.

The base substrate 2 is a substrate formed into a plate-like shape, and supports the back surface of the connector substrate 6, the back surface being the second surface 6b. This base substrate 2 is formed of a material having high heat dissipation characteristics such as copper in a way that the base substrate 2 is located away from the second high-frequency signal line 7b. That is, a concave part 2a is provided to the base substrate 2. The concave part 2a faces the second high-frequency signal line 7b, and is located away from the second high-frequency signal line 7b. Thus, in a case where the connector substrate 6 is provided on the base substrate 2, the base substrate 2 is prevented from contacting with the second high-frequency signal line 7b.

The concave part 2a is formed by removing a part of the base substrate 2, the part having a region larger than the second high-frequency signal line 7b, the region including a region which faces the second high-frequency signal line 7b. Because of the presence of the concave part 2a, a space is provided between the second high-frequency signal line 7b and the base substrate 2. This space is filled with air, and an air layer is formed therein.

As described above, in the first embodiment of the present invention, the second high-frequency signal line 7b is provided to the second surface 6b of the connector substrate 6, and the base substrate 2 is formed in a manner that the base substrate is located away from the second high-frequency signal line 7b on the second surface 6b. Thereby, the second high-frequency signal line 7b, which passes under the frame 5a, functions as a micro-strip line part. At this time, the air layer under the second high-frequency signal line 7b is dielectrics ($\in 1 > \in 2$). For this reason, in order to match impedance of the first high-frequency signal line 7a and the second high-frequency signal line 7b, and of the third high-frequency signal line 7c and the second high-frequency signal line 7b, it is necessary to set the width W2 of the second high-frequency signal line 7b larger than the widths W1 respectively of the first high-frequency signal line 7a and of the third high-frequency signal line 7c. Accordingly, the allowable current of the second high-frequency signal line 7b is increased, and melting of the second high-frequency signal line 7b due to high power can be suppressed. Hence, insertion loss of a high-frequency signal can be prevented from being increased.

Moreover, since a part of the base substrate 2, the part facing the second high-frequency signal line 7b is thin, it is made possible to suppress the occurrence of wraparound of a high-frequency signal at the time when the high-frequency signal passes the lead line 9. Accordingly, a high-frequency property can be enhanced. At this time, the base substrate 2 is made only partially thin, and is prevented from being made entirely thin. Hence, the mechanical strength of the base substrate 2 can be maintained.

The base substrate 2 includes the concave part 2a which faces the second high-frequency signal line 7b, and which is located away therefrom. Thereby, with a simple constitution, the second high-frequency signal line 7b passing under the frame 5a can be constituted as a micro-strip line part. Furthermore, the base substrate 2 can be easily formed in a manner that the base substrate 2 is located away from the second high-frequency signal line 7b.

In this event, as shown in FIG. 3, the width of the first high-frequency signal line 7a is indicated as W1, the width of the second high-frequency signal line 7b as W2, and the width of the concave part 2a as W3. As shown in FIG. 4, permittivity of the connector substrate 6 is set as $\in 1$, permittivity of air as $\in 2$, the thickness of the connector substrate 6 as t1, and the depth of the concave part 2a, i.e. the thickness of the air layer, as t2. In this case, when the semiconductor package 1A is designed with characteristic impedance set at 50Ω, various kinds of design values are obtained as those of Example shown in FIG. 5. Incidentally, a conventional semiconductor package was used for Comparative Example.

Figure 1:
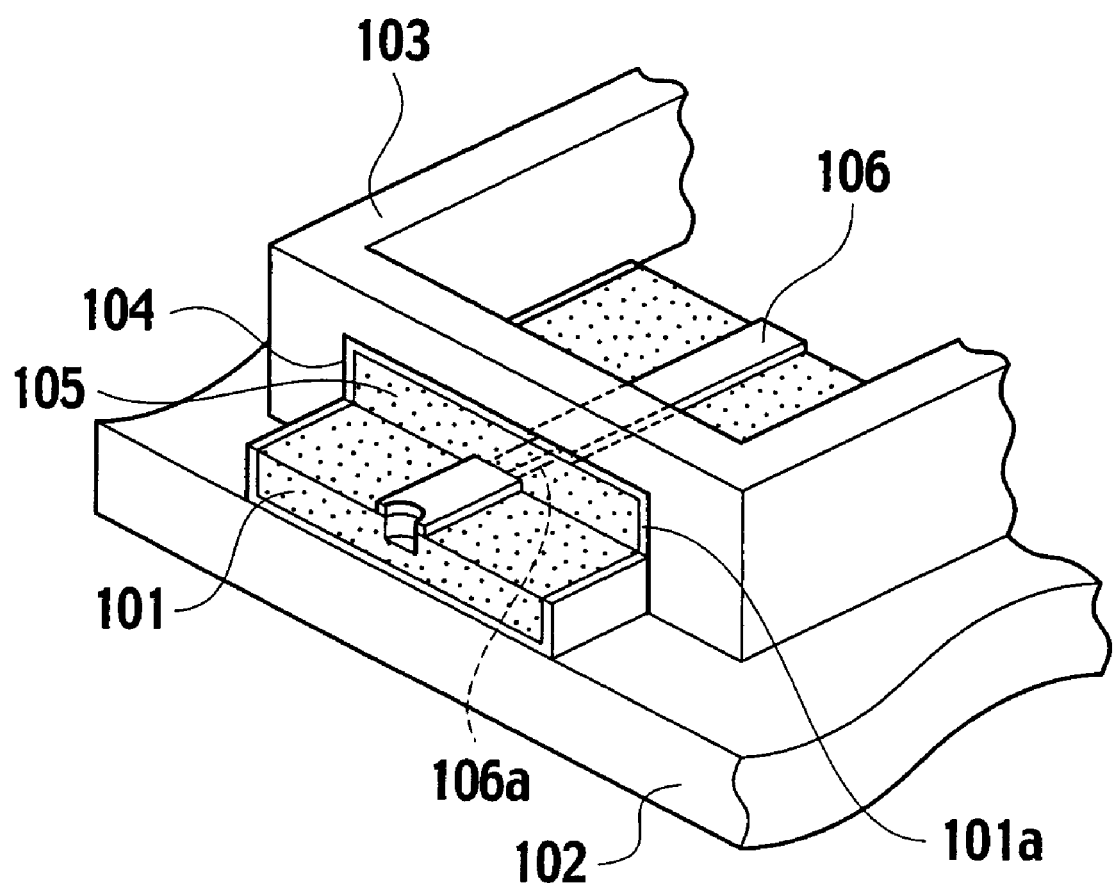
FIG. 1 is a perspective view showing a part of a conventional semiconductor package.

As shown in FIG. 5, in Example, the width W2 of a high-frequency signal line (the second high-frequency signal line 7b) was 0.644 mm. In Comparative Example, the width of a high-frequency signal line (a triconductor part 106a: refer to FIG. 1) was 0.148 mm. In addition, in Example, the width of a ground conductor was the width W3 of the concave part 2a, and was 3.0 mm. In Comparative Example, the width of a ground conductor was infinite (the width of the base substrate 102: refer to FIG. 1). Thus, with the semiconductor package 1A, a high-frequency signal line can be designed to have a width much larger than that of a strip line. Thereby, the allowable current of a connector part can be made large. In addition, the third high-frequency signal line 7c can be designed to have a width in the range of not less than W1 to not greater than W2. Thereby, the fastening strength of the lead wire 9 can be increased. Moreover, the width of the ground conductor can be reduced by the thickness t2 of the air layer. Hence, a favorable high-frequency property can be obtained.

Second Embodiment

A second embodiment of the present invention is described with reference to FIGS. 6 and 7.

In the second embodiment, different parts from those of the first embodiment are described. In the following descriptions and the drawings, the identical reference numerals are used to designate the identical or similar components, the descriptions of which will be omitted.

Figure 6:
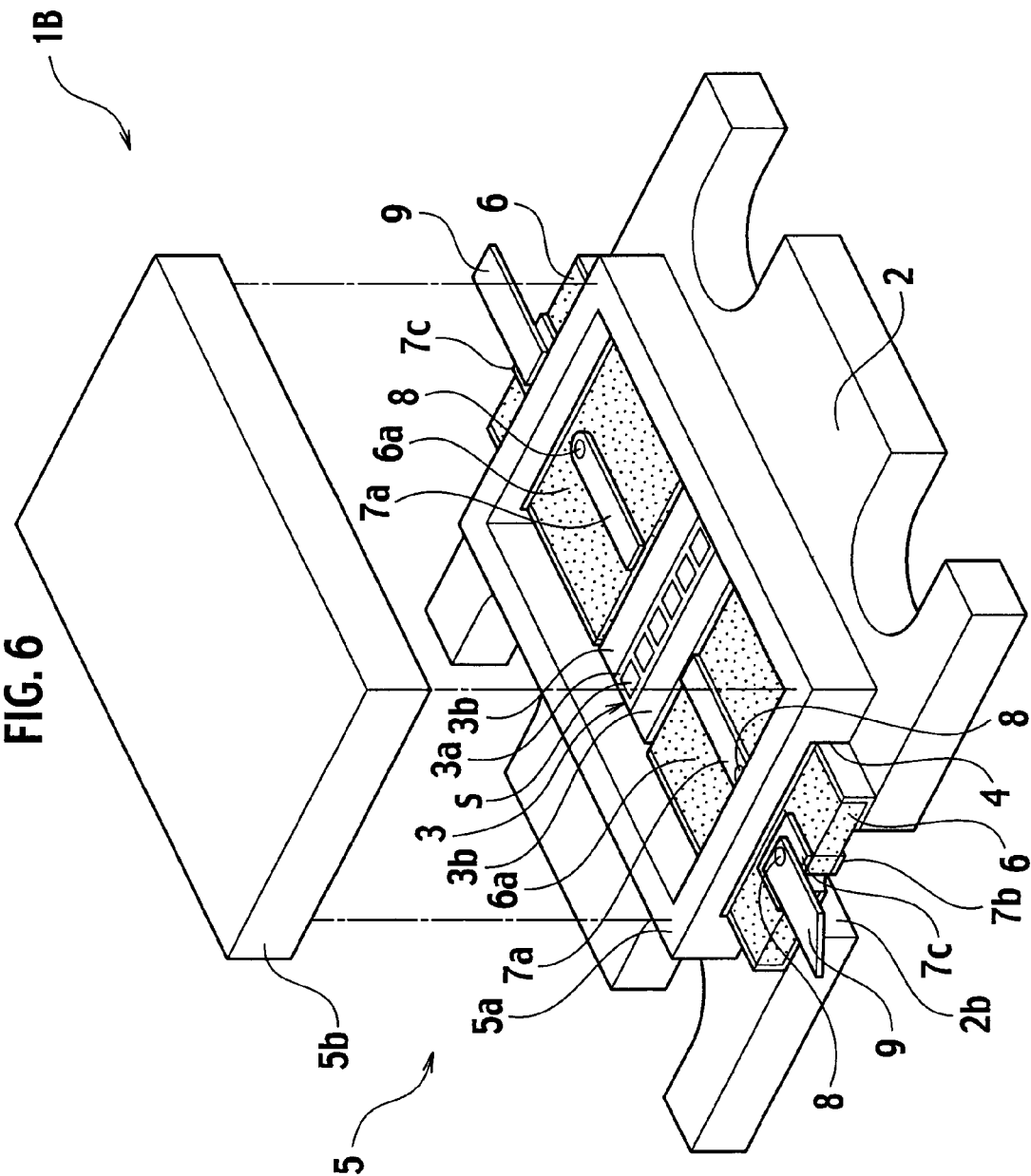
FIG. 6 is an exploded perspective view schematically showing a configuration of a semiconductor package of a second embodiment of the present invention.
Figure 7:
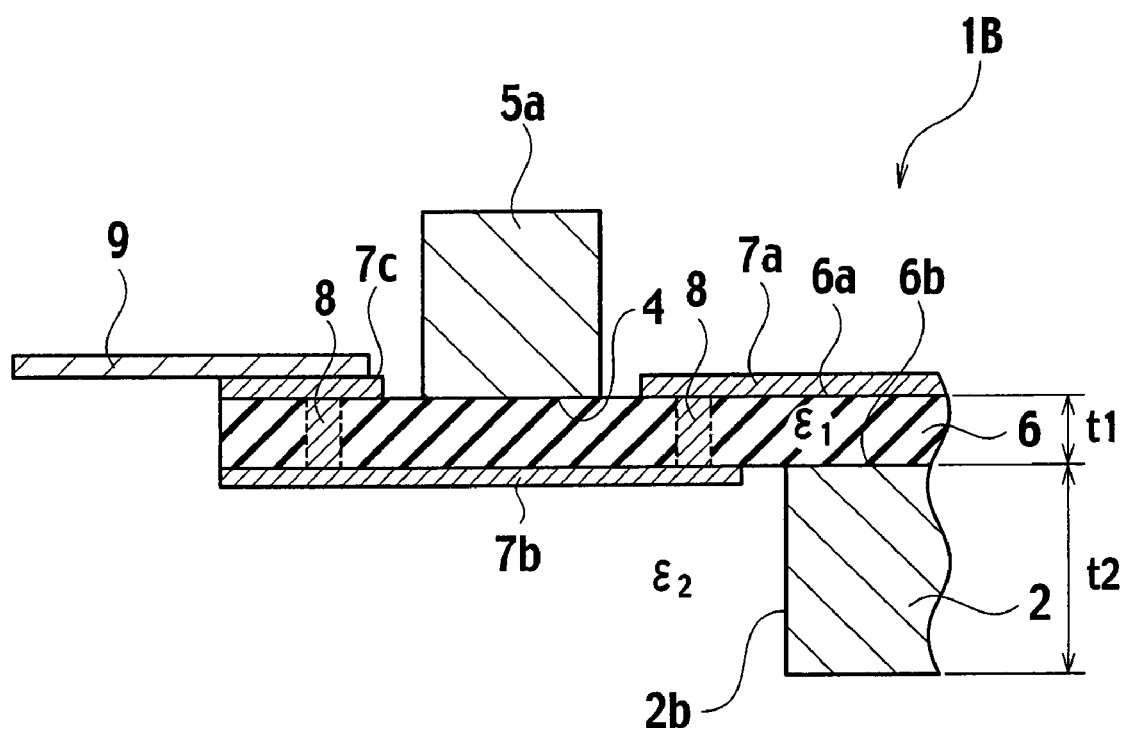
FIG. 7 is a cross-sectional view showing a part of the semiconductor package shown in FIG. 6.

As shown in FIGS. 6 and 7, to a base substrate 2 included in a semiconductor package 1B of the second embodiment of the present invention, a notch part 2b is provided in place of the concave part 2a in the first embodiment. The notch part 2b is located away from a second high-frequency signal line 7b. Thereby, in a case where a connector substrate 6 is provided on the base substrate 2, the base substrate 2 is prevented from contacting with the second high-frequency signal line 7b.

The notch part 2b is formed by notching a part of the base substrate 2, the part having a region larger than the second high-frequency signal line 7b, the region including a region which faces the second high-frequency signal line 7b. Because of the presence of the notch part 2b, a portion of the base substrate 2 in a position, which faces the second high-frequency signal line 7b, does not exist.

As described above, in the second embodiment of the present invention, a similar effect as that of the first embodiment can be obtained. Furthermore, by providing the notch part 2b to the base substrate 2, a portion of the base substrate 2 in a position, which faces the second high-frequency signal line 7b, does not exist. Thereby, the occurrence of wrap-around of a high-frequency signal at the time when the high-frequency signal passes a lead wire 9 can be more reliably suppressed compared with the case of the first embodiment. In addition, the lead wire 9 can be directly connected to the second high-frequency signal line 7b. In this case, the third high-frequency signal line 7c is not needed.

Incidentally, since the base substrate 2 includes the notch part 2b formed away from the second high-frequency signal line 7b, with a simple constitution, the second high-frequency signal line 7b passing under the frame 5a can be constituted as a micro-strip line part. Furthermore, the base substrate 2 can be easily formed in a manner that the base substrate 2 is located away from the second high-frequency signal line 7b.

Other Embodiments

It is to be understood that the present invention is not limited to the above-described embodiments, and various changes may be made therein without departing from the spirit of the present invention.

For example, in the above-described embodiments, various kinds of values have been described. However, the values are merely illustrative and not restrictive.

Moreover, in the above-described embodiments, respectively by way of the through-hole wirings 8, the second high-frequency signal line 7b is electrically connected to the third high-frequency signal line 7c which is on the first surface 6a of the connector substrate 6, and the lead wire 9 is connected to the third high-frequency signal line 7c. It is, however, not limited to the above. For example, the lead wire 9 may be connected to the second high-frequency signal line 7b without providing the third high-frequency signal line 7c.

What is claimed is:

1. A semiconductor package comprising:
   a base substrate on which semiconductor elements are disposed;
   a covering member which is provided to the base substrate, which covers the semiconductor elements, and which includes an opening at an end thereof at the side of the base substrate; and
   a connector substrate having a first surface and a second surface opposite to the first surface, the connector substrate provided on the base substrate in a manner that the connector substrate closes the opening, which includes a first high-frequency signal line in an area located inside the covering member on the first surface, and which includes a second high-frequency signal line on the second surface, the second high-frequency signal line being electrically connected to the first high-frequency signal line;
   wherein the first high-frequency signal lire and the base substrate provide a first micro-strip line part,
   the second high-frequency signal line and the base substrate provide a second micro-strip line part, and
   impedance of the first micro-strip line part is the same as impedance of the second micro-strip line part.

2. The semiconductor package according to claim 1, wherein width of the second high-frequency signal line is larger than width of the first high-frequency signal line in order to match impedance of the first micro-strip line part and the second micro-strip line part.

3. The semiconductor package according to claim 1, wherein the base substrate of the second micro-strip line part is thinner than the base substrate of the first micro-strip line part in order to match impedance of the first micro-strip line part and the second micro-strip line part.

4. The semiconductor package according to claim 1, wherein the base substrate is formed in a manner that the base substrate of the second micro-strip line part is located away from the second high-frequency signal line.

5. The semiconductor package according to claim 4, wherein the base substrate includes a concave part which keeps this base substrate of the second micro-strip line part away from the second high-frequency signal line.

6. The semiconductor package according to claim 5, wherein the concave part provides a space between the second high-frequency signal line and the base substrate of the second micro-strip line part, and the space is filled with air.

* * * * *